United States Patent [19]

Deeley et al.

[11] Patent Number: 5,898,677

[45] Date of Patent: *Apr. 27, 1999

[54] INTEGRATED CIRCUIT DEVICE HAVING A SWITCHED ROUTING NETWORK

[75] Inventors: Richard Deeley, San Jose; Carlos Dangelo, Los Gatos, both of Calif.

[73] Assignee: LSI Logic Corporation, Milpitas, Calif.

[*] Notice: This patent is subject to a terminal disclaimer.

[21] Appl. No.: 08/782,585

[22] Filed: Jan. 13, 1997

Related U.S. Application Data

[62] Division of application No. 08/294,973, Aug. 24, 1994, Pat. No. 5,615,126.

[51] Int. Cl.⁶ .................................................. H01L 29/00
[52] U.S. Cl. .................... 370/276; 340/825.86; 364/490; 257/210; 257/499; 395/871; 326/17; 370/537
[58] Field of Search ..................... 340/825.79, 825.85, 340/825.86; 364/489, 490, 491, 468.28; 257/208, 210, 202, 499; 395/871; 326/17; 370/537, 276

[56] References Cited

U.S. PATENT DOCUMENTS

| | | |
|---|---|---|
| 3,555,195 | 1/1971 | Rester et al. . |
| 3,573,740 | 4/1971 | Berger et al. . |
| 4,396,980 | 8/1983 | Hingarh .............................. 395/871 X |
| 4,639,620 | 1/1987 | Wagenmakers . |
| 4,755,765 | 7/1988 | Ferland . |
| 4,855,999 | 8/1989 | Chao . |
| 4,884,264 | 11/1989 | Servel et al. . |
| 4,939,729 | 7/1990 | Weisser . |
| 5,012,126 | 4/1991 | Feldbaumer et al. . |
| 5,233,603 | 8/1993 | Takeuchi et al. . |
| 5,237,184 | 8/1993 | Yonemary et al. ...................... 257/202 |
| 5,237,564 | 8/1993 | Lespagno et al. . |
| 5,341,309 | 8/1994 | Kawata . |
| 5,359,212 | 10/1994 | Kudou et al. ........................ 257/208 X |
| 5,475,680 | 12/1995 | Turner . |
| 5,495,422 | 2/1996 | Olson . |
| 5,615,126 | 3/1997 | Deeley et al. ........................... 364/489 |
| 5,625,563 | 4/1997 | Rostoker et al. .................... 364/490 X |

*Primary Examiner*—Edwin C. Holloway, III
*Assistant Examiner*—William H. Wilson, Jr.
*Attorney, Agent, or Firm*—Mitchell, Silberberg & Knupp LLP

[57] ABSTRACT

Signal area efficiency in integrated circuit designs is improved by increasing the information efficiency of signal wiring on an integrated circuit. Candidate signals are selected for combination by prioritizing signals according to length of travel, travel path, and information content. Signals with low information content and with greater distance between endpoints make poor utilization of fixed wiring and provide the best candidates for improvement. Candidate signals which travel similar (substantially parallel) paths from point to point across the integrated circuit are combined to improve chip area utilization efficiency. A variety of techniques are described for combining low-information-content signals onto a small number of wires, transmitting them over the small number of wires, and re-expanding them at their destination. Assuming that the combining/expanding circuitry occupies less space than the point-to-point wiring which would otherwise be required, there is a net reduction in chip area. One aspect of the invention is directed to using auto-routing switching techniques for combining signals. Another aspect is directed to applying these combining/expanding techniques to the integrated circuit design process.

2 Claims, 4 Drawing Sheets

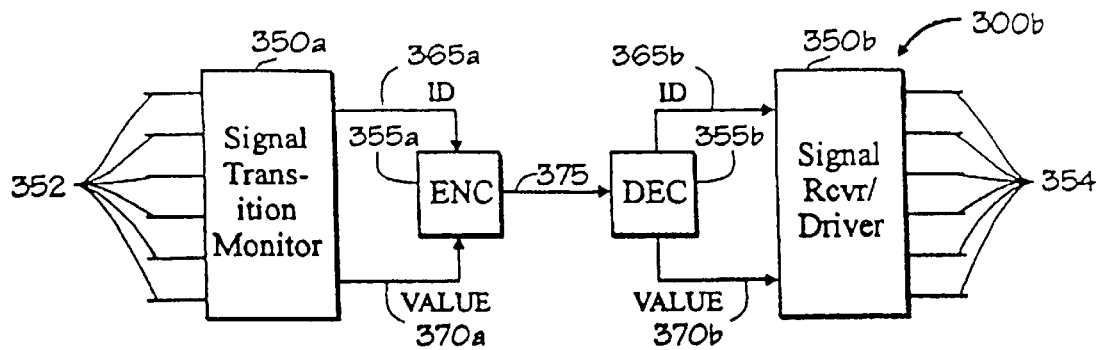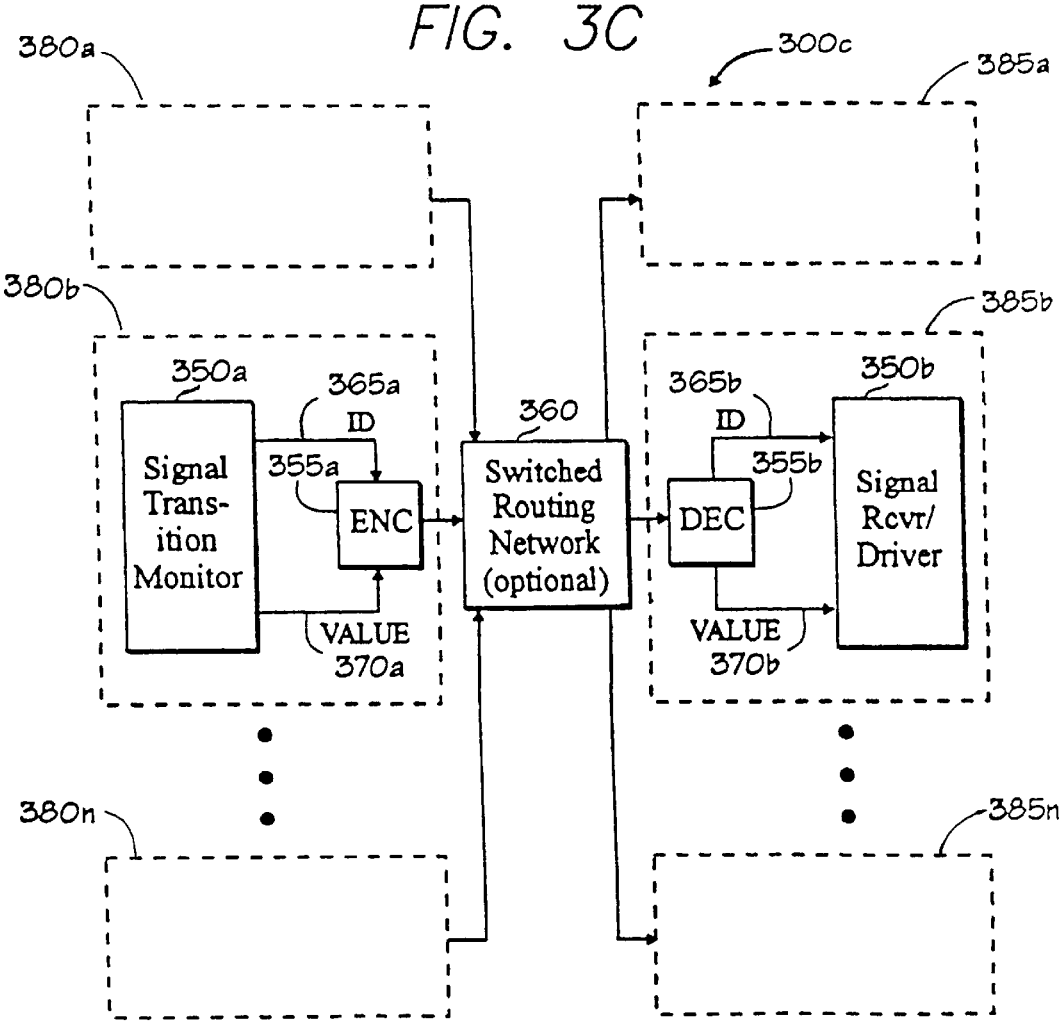

INTEGRATED CIRCUIT DEVICE HAVING A SWITCHED ROUTING NETWORK

CROSS REFERENCE TO RELATED APPLICATION

This is a divisional of application Ser. No. 08/294,973, filed on Aug. 24, 1994 now U.S. Pat. No. 5,615,126.

TECHNICAL FIELD OF THE INVENTION

The invention relates to the design and fabrication of integrated circuits, and more particularly to the routing of signals within integrated circuit device.

BACKGROUND OF THE INVENTION

Since the introduction of integrated circuitry some decades ago, integrated circuit technology has progressed steadily to provide continually increasing integrated circuit density and speed, while lowering power consumption. As a result, extremely complex integrated circuit designs have become possible, sometimes including up to millions of transistors. There is no indication that this trend towards higher density and speed in integrated circuits will abate, or reverse, at any time in the foreseeable future.

As the ability to increase logic capacity (density) of modern integrated circuitry has grown, so has the complexity of modern logic designs. Associated with such increased logic complexity and logic density, however, is a similar increase in interconnection density (i.e., the interconnections between logic elements on an integrated circuit chip.) Generally, the greater the number of logic elements which are employed in a logic design, the greater the number of logic signals which interconnect them. These interconnections can often occupy large areas on an integrated circuit die (semiconductor die), particularly when large busses and complex logic blocks are employed in the design of the integrated circuit.

In attempting to improve interconnection efficiency, designers will often employ multiplexing techniques or large parallel busses between logic blocks. FIGS. 1a and 1b are representative of these techniques.

FIG. 1a is a block diagram of a multiplexed circuit 100a wherein three logic blocks 110a (LOGIC BLOCK #1), 110b (LOGIC BLOCK #2) and 110c (LOGIC BLOCK #3) are interconnected via a multiplexer 120 (NUX). Well known in principle to those of ordinary skill in the art, the multiplexer 120 selects either the "n" input signals on lines 115a or the "m" input signals on lines 115b based upon the state of a selection signal (not shown), and presents the selected signals (115a or 115b) on its "k" output lines 115c to the block 110c, where "k", "m", and "n" refer to a number of signals being carried on lines 115c, 115b and 115a, respectively. In the example given, "k" must be a number which is at least as large as the greater of "m" and "n". By the use of the multiplexer 120, LOGIC BLOCK #3 110c can be caused to receive signals (115a, 115b) from either LOGIC BLOCK #1 110a or LOGIC BLOCK #2 110b, at any given time. Assuming that the multiplexer 120 (MWX) is located on the integrated circuit chip close to LOGIC BLOCK #1 110a and LOGIC BLOCK #2 110b, then the area required for signal routing is reduced by limiting the number of signals (i.e., "k" rather than "n+m") which must be routed to LOGIC BLOCK #3 110c.

FIG. 1b is a block diagram of a system (design) 100b employing a plurality of logic blocks 125a, 125b, 125c, and 125d interconnected by a common bus 135a. Bus buffers 130a, 130b, 130c, and 130d between the logic blocks 125a, 125b, 125c, and 125d, respectively, and the bus 135a provide means by which the logic blocks can receive data from the bus 135a and place data on the bus 135a. The bus buffers 130a, 130b, 130c, and 130d are designed and controlled such that only one bus buffer will drive (place data on) the bus 135a at any time. The logic blocks associated with the bus buffers (130a, 130b, 130c, or 130d) which are not driving the bus can receive the data which is being driven onto the bus. By bussing groups of common signals between logic blocks, wiring efficiency is improved as compared to providing discrete non-shared connections between the logic blocks.

Unfortunately, large busses can still occupy a great deal of chip area, particularly when a large number of logic blocks are interconnected by the bus. Chip space must be allocated for routing the bus to each of the logic blocks. If a logic block uses the bus infrequently, then the benefit received from the chip area utilized to connect the logic block is low.

Multiplexing and bus-connection techniques are effective in reducing the number of signal connections between logic blocks, but are largely ineffective in improving either information efficiency or utilization of the signal wires themselves. For example, for slowly changing digital signals (i.e., digital signals which change state only infrequently), information is conveyed only when the signals change from one state to the another (i.e., if the state of a signal is already known, then there is no significant benefit in retransmitting the state of the signal until it changes state). Since the bus connections and multiplexed connections described above are static connections (i.e., fixed), they occupy space but provide no benefit when they are idle (i.e., when the signal values carried thereon are unchanging). The following U.S. Patents are incorporated by reference herein: U.S. Pat. Nos. 4,639,620; 4,755,765; 4,855,999.; 4,939,729; 5,012,126; 5,045,714; 5,241,224; and 5,260,610.

SUMMARY OF THE INVENTION

It is therefore an object of the present invention to provide an improved technique for routing signals in integrated circuits, especially those employing standard cells.

It is a further object of the present invention to provide a technique for reducing the amount of die area required for signal routing in integrated circuits designs.

It is a further object of the present invention to provide a technique for increasing the information efficiency of interconnections in integrated circuits.

It is a further object of the present invention to reduce the number of static interconnections required in integrated circuits for slow or infrequently changing signals.

It is a further object of the present invention to provide a technique for dynamic signal routing in integrated circuits.

It is a further object of the present invention to provide a technique for specifying signal connections in integrated circuits such that they can be readily applied to a dynamic routing scheme.

According to the invention, signal area efficiency (i.e., utilization of space on an integrated circuit die) can be improved by increasing the information efficiency of signal wiring on an integrated circuit. It is possible to take advantage of low signal information content by "weighing" (comparing) the area occupied by the signal wiring against its information content and the complexity of reproducing the signals from a simpler signal. By taking advantage of signal characteristics, it is possible to carry (combine) the information for a large number of signals on a single wire or on a reduced number of wires (rather than on individual wires for individual signals), thereby reducing wiring area and routing complexity. If the area required by circuitry to reconstruct the signals is less than the area otherwise required (e.g., by the individual wires for individual signals), then there is a net gain in chip area utilization efficiency. Assuming that the "combined" signals travel substantially parallel paths across the integrated circuit, there can be a significant improvement in chip area utilization. At the same time, the information efficiency of the wire or wires used to carry the signals is increased by causing the wire(s) to carry signal transitions at much closer to its raw data rate (the maximum rate at which signal transitions can be propagated along the wire).

According to a feature of the invention, "candidate" signals are selected for combination by prioritizing signals according to length of travel, travel path, and information content. Signals with low information content and with greater distance between endpoints make poor utilization of fixed wiring and provide the best candidates for improvement. Conversely, signals with relatively short travel and high information content (complex and rapidly changing state) make reasonably good utilization of fixed point-to-point wiring and should be left alone (i.e., make poor candidates for improvement). Candidate signals which travel similar (substantially parallel) paths from point-to-point across the integrated circuit are advantageously combined to improve chip area utilization efficiency.

Further, according to the invention, multiple fixed-relationship timing signals can be recreated at multiple locations on an integrated circuit chip, thereby permitting a smaller number of simpler timing signals to travel the greatest distance. This technique is most advantageous when the chip area required to recreate the signals is less than the chip area required for routing the signals themselves (individually).

According to an aspect of the invention, low-information-content signals can be combined together across a small number of wires by multiplexing them together. Each signal has a source and a destination. Source signals are selected by the multiplexer (using a selection circuit) according to the known timing of their state transitions. The combined signals are transmitted over a single wire or a small (relatively few) number of wires. At the destination end of the wires, the multiplexed signals are de-multiplexed, again according to state transition timing, such that appropriate state transitions are routed to the proper destinations.

According to another aspect of the invention, a similar technique can be applied in the reverse direction to provide "full-duplex" or bi-directional communication along a signal path.

According to another aspect of the invention, many different mux/demux (multiplexing/demultiplexing) circuits of this type can be employed to combine low-information content signals for transmission based upon the area distribution of signals on an integrated circuit. A different technique is to transmit signal information such that each source signal is given an ID (identification) tag, and the ID tag and the value for the source signal are transmitted together from end-to-end, and are then routed to the appropriate destination. This is called "auto-routing" and is described hereinbelow with respect to FIGS. 3b and 3c.

According to another aspect of the invention, an auto-routing switching system can be employed to combine low-information content signals. In such a system, a plurality of substantially co-located source signals (signals emanating from sources that are close to one another on the semiconductor die) are transmitted to a like plurality of substantially co-located destination signals using fewer wires than the number of source signal or destination signals. According to the invention, a signal transition monitor looks for state transitions on the source signals. Upon detecting such a transition, the signal transition monitor generates an ID tag corresponding to the specific signal for which the transition was detected and a signal value indicating the nature (e.g., logic state or polarity) of the transition. An encoder encodes the ID tag and value into a "packet" for transmission over a reduced (versus a fixed point-to-point) number of wires (conductive lines in the die). A decoder decodes the packet, re-generating the ID tag and value, and presents them to a signal receiver/driver which re-generates the appropriate signal transition on the appropriate destination signal, according to the received ID tag and value.

According to an aspect of the invention, a plurality of signal transition monitors and encoders can be used to communicate with a plurality of decoders and signal receivers/drivers by interconnecting them via a switched routing network to provide "flexible" inter-connections between the various transmitting circuits and receiving circuits. This switched routing network is essentially a cross-point switching matrix which behaves analogously to a telephone switching network in that it utilizes the ID tag in the encoded signal from the transmitting circuit much like a telephone number to select the appropriate receiving circuit and to establish a connection thereto. The maximum number of connections which can be established through the switched routing network can be significantly less than the number of transmitting circuits or receiving circuits, thereby reducing the amount of wiring required as compared to that which would be required if fixed point-to-point wiring were employed between the transmitting circuits and receiving circuits.

According to an aspect of the invention, the aforementioned "packets" can be transmitted either in pre-determined "frames" or time slots, or can be transmitted "on-demand". The packets can be transmitted in serial, parallel, or combined serial/parallel format.

According to the invention, a method for reducing the chip area required to route signals, by combining low-information-content signals, is incorporated into an integrated circuit design process. The method comprises the steps of:

a) providing a digital design, the digital design comprising a plurality of logic elements requiring interconnection;

b) performing a preliminary layout to place the logic elements of the digital design into geographical regions of an integrated circuit chip;

c) creating geographically-related groups of signals such that each group contains only signals which travel between substantially the same geographical regions of the integrate circuit chip;

d) determining a maximum feasible raw data rate for signals in each group based upon the integrated circuit technology, path length, and layout;

e) performing a timing analysis to establish information content of each signal and timing relationships between state transitions on different signals;

f) further grouping signals within each group into sub-groups;

g) combining the subgroups of signals onto a reduced number of wires using a suitable combining technique such that a resulting raw data rate on the reduced number of wires does not exceed the maximum feasible raw data rate established in step d);

h) comparing the area required by the signal combining technique to that which would be required by the signals if wired directly in point-to-point fashion;

i) if the area of the combined signals and combining circuitry results in a net reduction in wiring area, inserting the combining technique into the integrated circuit design, otherwise repeating steps f)–h), each time selecting different sub-groups of signals and different combining techniques until a net reduction in area is realized;

j) if no net reduction in area can be achieved, leaving the integrated circuit design unchanged; and k) repeating steps f)–j) for each group of signals.

Other objects, features and advantages of the invention will become apparent in light of the following description thereof.

BRIEF DESCRIPTION OF THE DRAWINGS

FIG. 3b is a block diagram of a digital system employing a self-routing switching system for improving wiring information efficiency, according to the invention.

FIG. 3c is a block diagram of another digital system employing self-routing switching techniques for improving wiring information efficiency, according to the invention.

DETAILED DESCRIPTION OF THE INVENTION

According to well-known information theory, only changes of state (i.e., a move to a condition different from that which previously existed) carry any information content. For example, a DC (direct current) signal carries no information other than its value. Once its value is known, it carries no additional information whatsoever. A stable AC (alternating current) signal, such as a fixed amplitude sine wave, is similar in this regard—once its amplitude and phase are known, no other information is carried. It is not until some sort of information modulation is applied to the sine wave that any information is carried. Phase, frequency, and/or amplitude modulation can be applied to a sine wave to carry information.

Similarly, a typical binary digital signal, which can assume one of only two states, carries no information until it changes from one state to another. This means that the total information content of binary digital signals is conveyed essentially only at the state transition "edges" (points of transition from one binary state to the other binary state). The static value of the binary signal between state changes carries no useful information.

Digital clock signals are similar in information content to the AC sine wave signal described above. Even though there may be many logic state transitions, they occur at regular intervals and are intended to be absolutely predictable. As such, they carry no information other than their repetition rate and phase. This is true of any repeating signal, regardless of the repeating pattern. Once the form of the repeating pattern is known and its repetition rate are known, no other information is carried by the signal.

Figure 1A:
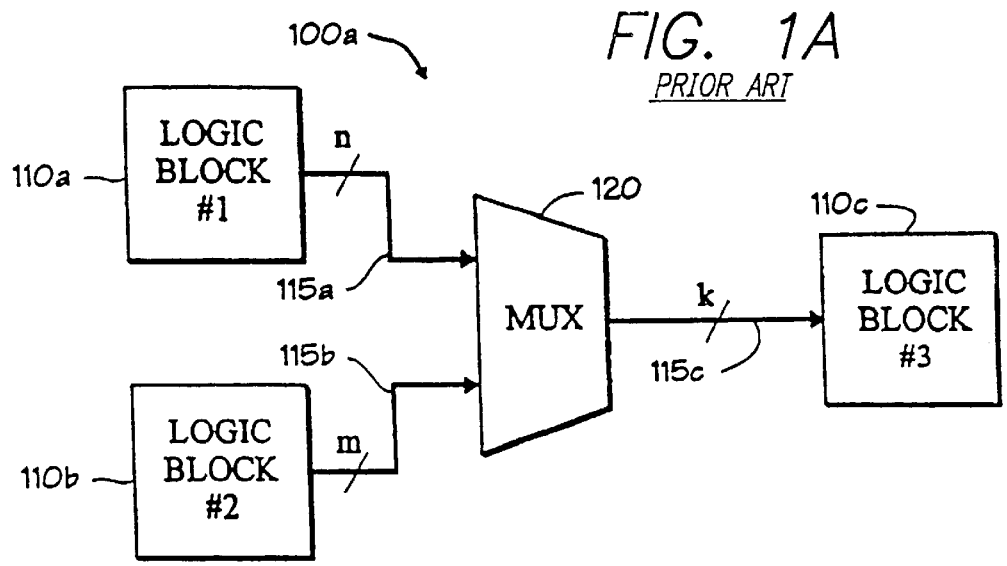
FIG. 1a is a block diagram of a prior art circuit employing a multiplexer.
Figure 1B:
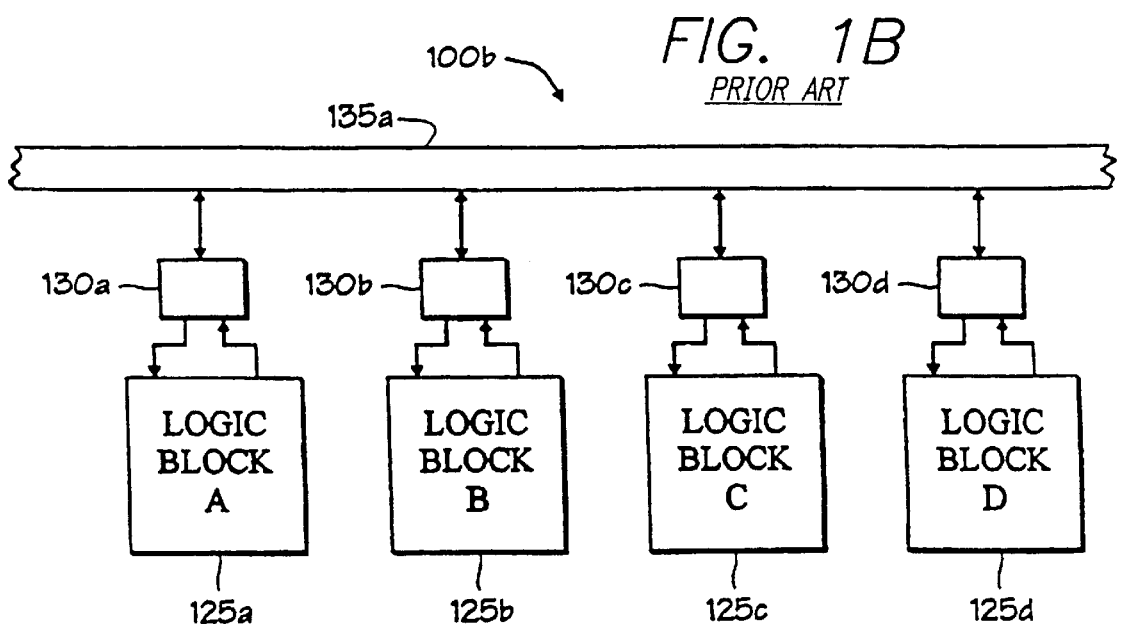
FIG. 1b is a block diagram of a prior-art bus-connected circuit.
Figure 2:
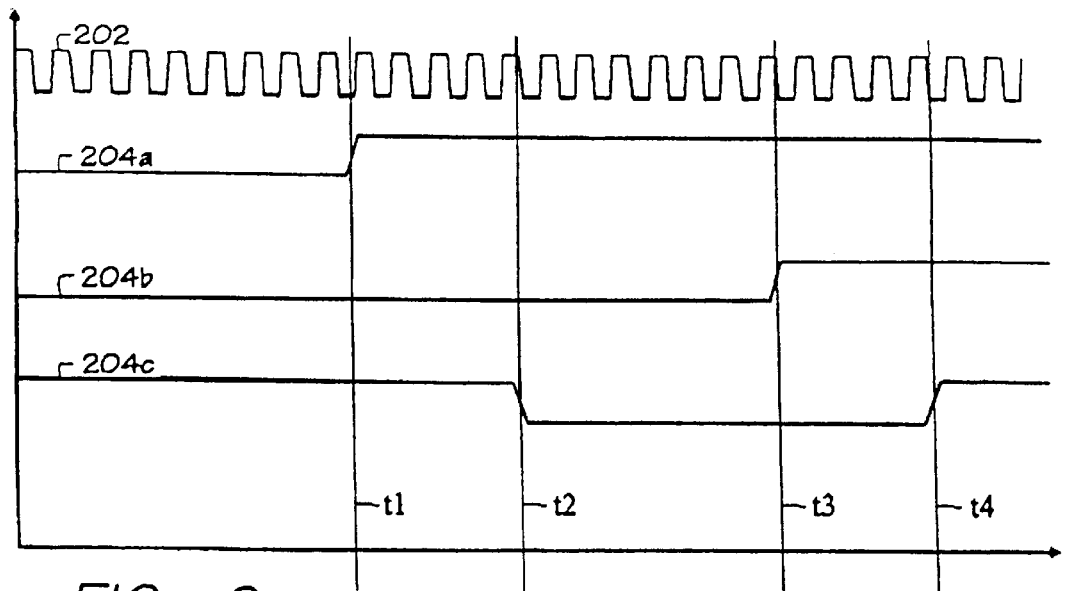
FIG. 2 is a logic timing diagram showing a set of typical digital signals, illustrating a case where utilizing the present invention would be advantageous.

FIG. 2 is a logic timing diagram illustrating the time relationships between four digital signals 202, 204a, 204b, and 204c. Signal 202 is a digital clock signal with 50% duty cycle. Beyond its frequency and phase, it carries no information. Even though it generates a great number of logic state transitions, the state transitions themselves (by virtue of their absolute predictability) have no information content. In this case, the absence of a pair of state transitions (e.g., a missing clock pulse) could carry information. As relevant to the present invention, however, the frequency of state transitions on the clock signal 202 does indicate that the signal line carrying it is capable of at least that raw data rate (i.e., at least that frequency of state transitions can occur on the signal line carrying the clock signals, because they do, in fact, occur). For the purposes of this example, it will be assumed that any signal line can carry at least the frequency of state transitions that occurs on the clock signal 202.

Signal 204a starts in an initially low state, then transitions to a logic high state at time "t1". Signal 204b has an initially low state and transitions to a high state at time "t3". Signal 204c has an initially high state, transitions to a low state at time "t2", and then transitions to a high state again at time "t4". The only information carried by these three signals (204a, 204b, and 204c) is carried at times "t1", "t2", "t3", and "t4". Further, if these signals (204a–c) are related to one another in a manner such that they are known to occur with the order of their state transitions always the same, then a simple series of narrow pulses at "t1", "t2", "t3" and "t4", on a single wire could be used by a logic circuit to re-create the signals 204a–c, rather than by using four individual wires. Still further, if the time relationship between the state transitions on signals 204a–c is also constant (i.e., the relative times between "t1", "t2", "t3" and "t4" are constant), then a single pulse at time "t1" (or shortly prior thereto) can be used by a logic timing circuit to re-generate the predictable sequence of signals 204a–c. Generally, signals such as those exemplified by 204a, 204b and 204c are considered to be low-information-content signals. Generally, the less the information content of a signal, the higher its predictability. Such predictable signal characteristics are advantageously utilized by the present invention. Notably, the rate at which the transitions occur in the signals 204a, 204b and 204c, even when considered together, are at less than the raw data rate capability of a wire (compare 202).

According to the invention, it is possible to take advantage of signal characteristics such as these (e.g., the relationships between the signals 204a, 204b and 204c) by weighing the area occupied by the signal wiring against its information content and the complexity of reproducing the signals from a simpler signal. For example, three wires would normally be required to carry signals 204a–c as depicted in FIG. 2. If the three wires must travel any significant distance across an integrated circuit, then they contribute to wiring area and routing complexity. (Increased routing complexity can also contribute to wiring area by lengthening signal paths.) By taking advantage of the aforementioned signal characteristics, it may be possible to carry the information for the three signals 204a–c on a single wire, thereby reducing wiring area and routing complexity. If the area required by circuitry to re-construct the signals is less than the area required by the two (three minus one) additional wires, then there will be a net gain in chip area utilization efficiency.

Taking this concept a step further, many (e.g., more than three) low-information-content signals can be multiplexed onto a single wire, or onto a small (reduced, versus individual) number of wires in this manner. Assuming that these signals must travel substantially parallel paths across the integrated circuit, there can be a significant improvement in chip area utilization. At the same time, the information efficiency of the wire or wires used to carry the signals is increased by causing the wire(s) to carry signal transitions at much closer to its raw data rate (the maximum rate at which signal transitions can be propagated along the wire).

According to the invention, "candidate" signals can be selected during the design process for combination by prioritizing signals according to the length of travel, travel path, and information content. Signals with low information content (i.e., with static or slowly changing state) and with longer travel (i.e., greater distance between endpoints on the integrated circuit die) make poor utilization of fixed wiring and provide the best candidates for improvement. Conversely, signals with relatively short travel and high information content (complex and rapidly changing state) make reasonably good utilization of fixed point-to-point wiring and should be left alone. Candidate signals which travel similar (substantially parallel) paths from point to point across the integrated circuit can be combined as described above to improve chip area utilization efficiency.

A similar technique can be applied to fixed-relationship timing signals (e.g., multiple clock-synchronized timing signals). A reduced number of wires can be used to carry a master-clock and relative phase information, with local circuitry being used to reconstruct multiple timing signals. Assuming that the area required by circuitry to reconstruct the timing signals is less than the chip area required to carry all of the timing signals individually, then there is a net gain. Further, since the information content of the "master" timing signal is relatively low, it may be possible to multiplex other signals onto the same wires for further increases in information and area efficiency on the die.

Figure 3A:
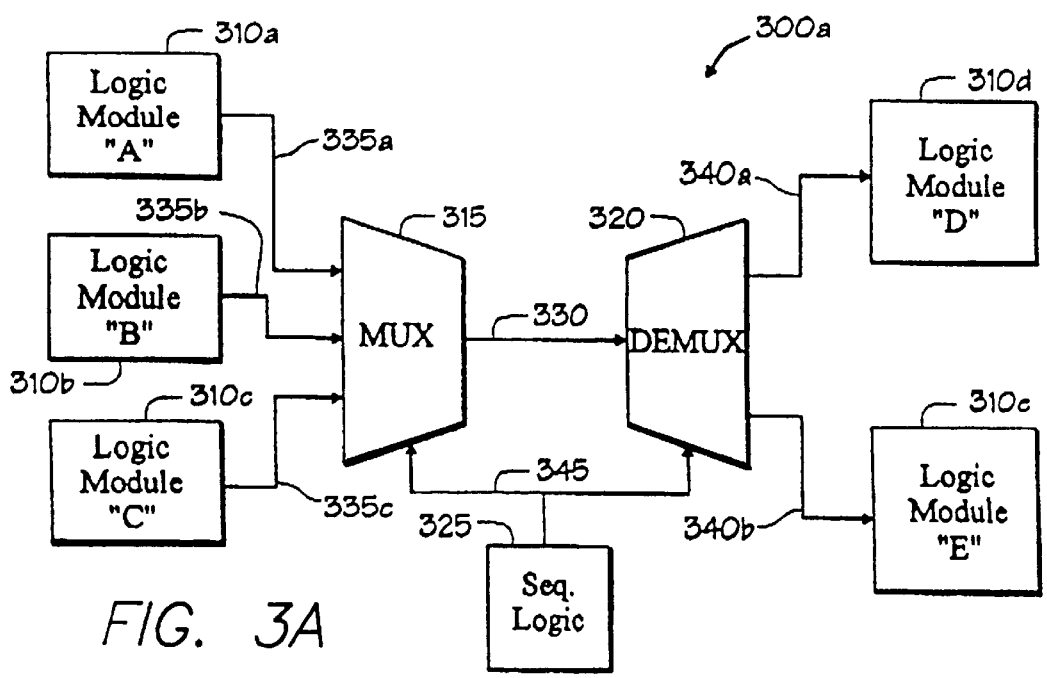
FIG. 3a is a block diagram of a digital system illustrating a technique for improving wiring information efficiency, according to the invention.

FIG. 3a is a block diagram of one technique which can be used to combine low-information-content signals together across a small (relatively few, as compared with individual wires per signal) number of wires. In an integrated circuit design 300a, source signals 335a, 335b, and 335c, generally located in a first geographic area of the die and generated by logic modules "A" 310a, "B" 310b, and "C" 310c, respectively, must travel across the integrated circuit die to destinations 340a and 340b associated with logic modules "D" 310d and "E", 310e respectively, generally located in a second geographic area or the die. For this example, it is assumed that the logic modules "D" 310d and "E" 310e are edge-triggered by the destination signals 340a and 340b, respectively (i.e., an action occurs on a particular edge, rising and/or falling, of signals 340a and 340b).

The signals 335a–c are combined via a multiplexer 315 onto a single signal wire 330. It is assumed that state transitions on signals 335a–c are not coincident, or that a delay in receipt of the signal does not adversely affect circuit performance. A demultiplexer 320 receives the signal on wire 330 and routes it to either logic module "D" 310d or logic module "E" 310e. Sequencing logic 325 selects which of the source signals (335a–c) is selected by the multiplexer 315 and which of the destination signals (340a–b) is selected by the demultiplexer 320.

The sequencing logic 325 is specifically designed to select the appropriate source signals (335a–c) and destination signals (340a–b) at the appropriate times based upon known timing characteristics of the circuit 300a. It should be noted that there need not necessarily be a one-for-one correspondence between source signals and destination signals. This is because it is only information content which is important, rather than a particular direct mapping of signals. For example, in the circuit 300a shown, action could be taken in logic module "D" 310d based upon edges of any of the three input signals. The same can be said of logic module "E" 310e. Ordinarily, a logic network might be used to encode the states of the three source signals 335a–c onto two wires 340a,b. With the multiplexing scheme shown, however, it is possible to eliminate this. (In fact, the multiplexers themselves do this job.)

As shown, it is not possible to operate logic modules "D" 310d and "E" 310e coincidentally, since only one logic module can be addressed at a time by the demultiplexer 320. However, if a different type of decoder (possibly including buffers) is substituted for the demultiplexer 320, a situation where a signal is to be presented to both logic modules "D" 310d and "E" 310e can be accommodated. Similarly, a different type of encoder can be substituted for the multiplexer 315 to accommodate information transmission based upon combinations of the input signals. The sequencing logic 325 would be re-designed accordingly.

The circuit 300a shown in FIG. 3a is essentially "half-duplex" in nature, that is, signals travel in one direction only. Signals can also be accommodated in the reverse direction, providing "full-duplex" operation. If the reverse direction signals have high-information-content and make good utilization of wiring bandwidth, then they can be wired directly using static connections. If however, the reverse direction signals have relatively low information content, then they are candidates for the type of signal combination shown in FIG. 3a. A full-duplex system would, in essence, include the mirror image of FIG. 3a.

If signal timing characteristics permit, it is also possible to use a single wire in a bus-like fashion to transmit signals in both directions, such that the wire carries information in one direction along its length at some times and in the opposite direction along its length at other times. Those of ordinary skill in the art will immediately understand that this can be accomplished by using tri-state (or similar, e.g. open drain) drive circuits.

Many different circuits of the type shown in FIG. 3a can be employed to combine low-information content signals for transmission based upon the area distribution of signals on an integrated circuit. For example, if low-information-content signals in a particular integrated circuit design tend to travel along five major parallel routes, then it may be appropriate to combine them using five circuits of the type shown and described with respect to FIG. 3a.

The circuit of FIG. 3a shows direct routing of signals over a wire such that the wire actually assumes the value of one of the source signals (or some logical combination of the source signals) at any given time. According to the invention, a different (than the multiplexing) technique can be used to transmit signal information such that each source signal is given an ID tag, and the ID tag and the value for the source signal are transmitted together from end to end, then routed to the appropriate destination. This is called "auto-routing" and is described hereinbelow with respect to FIGS. 3b and 3c.

FIG. 3b is a block diagram of a digital system 300b employing an auto-routing switching system for improving wiring information efficiency and area utilization. In the system 300b, a plurality of substantially co-located (close to one another on the die) source signals 352 are to be transmitted to a like plurality of substantially co-located destination signals 354 over reduced wiring 375. The reduced wiring 375 comprises fewer wires than the number of source signal 352 or destination signals 354, and can be as simple as a single wire (375). In this scheme, a signal transition monitor 350a looks for state transitions on the source signals 352. Upon detecting such a transition, the signal transition monitor 350a generates an ID tag 365a corresponding to the specific signal for which the transition was detected and a signal value 370a indicating the nature (e.g., logic state or polarity) of the transition. An encoder 355a encodes the ID tag and value into a "packet" for transmission over the reduced wiring 375. A decoder 355b decodes the packet, re-generating the ID tag 365b and value 370b, and presenting them to a signal receiver/driver 350b which re-generates the appropriate signal transition on the appropriate destination signal 354, according to the received ID tag 365b and value 370b.

It will immediately be understood by one of ordinary skill in the art, based on the description contained herein, that the system 300b can be made bi-directional or "full-duplex" simply by duplicating it in the reverse direction, in a manner similar to that described above with respect to FIG. 3a.

FIG. 3c is a block diagram of a system (portion of an integrated circuit) 300c wherein multiple sets of source signals and destination signals can be switched. In this system 300c, a plurality of transmitting circuits 380a,b . . . n are employed. Each transmitting circuit includes a signal transition monitor 350a and an encoder 355a, similar to those described hereinabove with respect to FIG. 3b. The system 300c also includes a plurality of receiving circuits 385a,b, . . . n, each including a decoder 355b and a signal driver/receiver 350b, similar to those described hereinabove with respect to FIG. 3b. If signal timing permits, the encoded signals can be transmitted over a common medium. However, in the case shown in FIG. 3c, a more flexible scheme is used. A switched routing network 360 is employed to provide flexible connections between the various transmitting circuits and receiving circuits. This switched routing network 360 behaves much like a telephone network in that it utilizes the ID tag in the encoded signal from the transmitting circuit (380'x') much like a telephone number to select the appropriate receiving circuit (385'x') and to establish a connection thereto. The maximum number of connections which can be established through the switched routing network 360 can be significantly less than the number of transmitting circuits (380'x') or receiving circuits (385'x'), thereby reducing the amount of wiring required as compared to that which would be required if fixed point-to-point wiring were employed between the transmitting circuits (380'x') and receiving circuits (385'x').

Figure 4A:
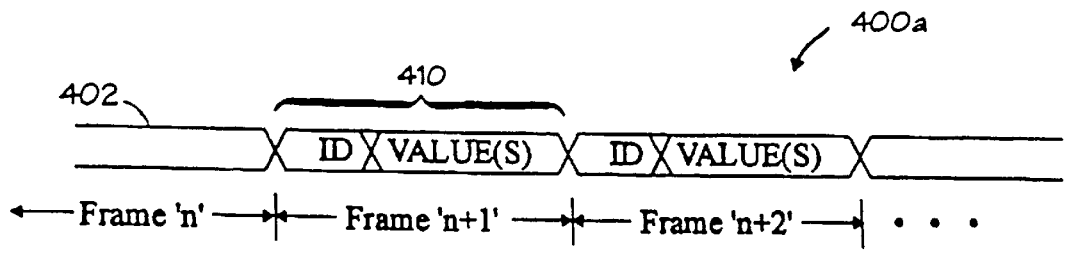
FIGS. 4a and 4b are logic timing diagrams illustrating two different signal formats for self-routing switching, according to the invention.
Figure 4B:
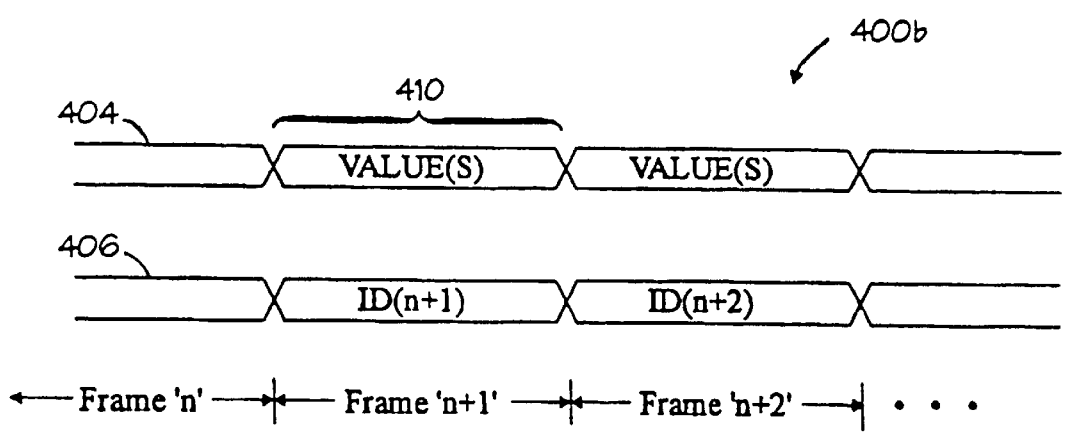

Those of ordinary skill in the art will immediately appreciate that the aforementioned "packets" can be transmitted either in pre-determined "frames" or time slots, or can be transmitted "on-demand", in light of the description contained herein. Those of ordinary skill in the art will also understand that many different "packet" formats can be used. These include, for example, serial encoding of ID tag and value over a single wire, parallel encoding of ID tag and value, and serial-parallel coding whereby, e.g., the ID tag and value are encoded individually in separate parallel formats which are transmitted one after the other. FIGS. 4a and 4b are logic timing diagrams illustrating two different representative packet transmission formats for auto-routing switching. Although FIGS. 4a and 4b illustrate transmission in a fixed "frame" or time slot format, those of ordinary skill in the art will immediately appreciate that this can readily be adapted to an "on-demand" transmission scheme, or any other suitable transmission scheme.

FIG. 4a is a logic timing diagram 400a depicting a serial packet transmission scheme whereby an encoded signal 402 (see e.g., the reduced wiring 375, FIG. 3b, between encoder 355a and decoder 355b) is transmitted in a fixed frame format such that within a frame 410 such that an ID tag is transmitted first, followed by one or more signal values. Frames occur one after the other in serial fashion, such that frame 'n+1' follows frame 'n', frame 'n+2' follows frame 'n+1', etc. Each frame can contain a different ID tag and value(s). The encoded signal 402 can be transmitted in bit-serial fashion (in which case only one wire is required) or in word-serial fashion (in which case the number of wires required is determined by the larger of the ID tag or value(s)). Evidently, word-serial transmission provides faster end-to-end response, but requires more wires. Conversely, bit-serial transmission requires only one wire but provides slower end-to-end throughput (response).

FIG. 4b is a logic timing diagram 400b illustrating a different framed packet format whereby the ID tag and values are transmitted at the same time on separate signals (406 and 404, respectively). As before the ID tag signal (406) and the value signal are organized in sequentially occurring frames, with one ID tag and one value (set of values) occurring per frame 410. The ID tag signal 406 and/or the value signal 404 can be transmitted in either bit-serial or word-serial fashion. As before, the more wires, the faster the end-to-end throughput and the greater the wiring area required.

In order to best apply the techniques described above, it is desirable to provide a method for selecting signals to be combined (i.e., transmitted over a small number of wires by taking advantage of low information content) as a part of the integrated circuit design process. It will be immediately understood by one of ordinary skill in the art that any of the signal combining techniques described hereinabove can be implemented as standard IC (integrated circuit) "building blocks" and implemented as library components on an ECAD (Electronic Computer Aided Design) system. A large number of different signal combining "building blocks" or library components can be pre-designed and placed in an ECAD component library to make a wide variety of combining techniques available on the ECAD system.

Once a digital system (to be implemented in an integrated circuit) is designed, a preliminary layout can be performed. (Tools for preliminary layout or "floorplanning" are widely known and used in the art). This preliminary layout or "floorplan" of the integrated circuit is then used to establish signal sources and destinations. A timing analysis is then performed on the design to determine the information content of each signal (i.e., the signal's frequency of state change and timing of state changes relative to other signals). Signals are then grouped by geographical "region" and destination, i.e., signals which travel in substantially the same direction between substantially the same locations in the integrated circuit are grouped together. A maximum feasible "information content" or raw data rate is determined for signals traveling between the geographical "regions" connected by the group of signals. Signal characteristics (established during timing analysis) are examined and a suitable signal combining technique is selected from the library of signal-combining components. Signals are then combined onto a smaller number of wires using the selected technique such that the raw data rate of the combined signals does not exceed the previously established maximum feasible raw data rate of the smaller number of wires. The area required by the signal combining technique is compared to that which would have been required by the signals if wired directly in point-to-point fashion. If the area of the combined signals (and combining circuitry) is less, then a net reduction is wiring area is achieved and the combining technique is inserted into the integrated circuit design. If there is not a net reduction in area, the process can be repeated, selecting different groups of signals and/or different combining techniques until a net reduction in area is realized. If no net reduction in area can be achieved, the integrated circuit design is left unchanged.

This process is repeated for all geographical groupings of signals to minimize overall wiring area required by the design. Once the process is complete for all geographical groupings of signals, a final layout of the integrated circuit is performed.

In summary, then, the process of reducing wiring area for an integrated circuit design is as follows:

a) providing a digital design, the digital design comprising a plurality of interconnected logic elements;

b) performing a preliminary layout to place the logic elements of the digital design into geographical regions of an integrated circuit chip;

c) creating geographically-related groups of signals such that each group contains only signals which travel between substantially the same geographical regions of the integrate circuit chip;

d) determining a maximum feasible raw data rate for signals in each group based upon the integrated circuit technology, path length, and layout;

e) performing a timing analysis to establish information content of each signal and timing relationships between state transitions on different signals;

f) further grouping signals within each group into sub-groups;

g) combining the subgroups of signals onto a reduced number of wires using a suitable combining technique such that a resulting raw data rate on the reduced number of wires does not exceed the maximum feasible raw data rate established in step d);

h) comparing the area required by the signal combining technique to that which would be required by the signals if wired directly in point-to-point fashion;

i) if the area of the combined signals and combining circuitry results in a net reduction in wiring area, inserting the combining technique into the integrated circuit design, otherwise repeating steps f)–h), each time selecting different sub-groups of signals and different combining techniques until a net reduction in area is realized;

j) if no net reduction in area can be achieved, leaving the integrated circuit design unchanged; and k) repeating steps f)–j) for each group of signals.

The above, and other objects, features, advantages and embodiments of the invention, including other (i.e., additional) embodiments of the techniques discussed above may become apparent to one having ordinary skill in the art to which this invention most nearly pertains, and such other and additional embodiments are deemed to be within the spirit and scope of the present invention.

What is claimed is:

1. An integrated circuit device comprising:

a plurality of transmitting circuits, each including a signal transition monitor and an encoder for providing an encoded signal;

a plurality of receiving circuits, each including a signal decoder and a signal driver/receiver; and a switched routing network over which the encoded signals are transmitted to said receiving circuits;

wherein the maximum number of connections which can be established through said network is less than the number of said transmitting circuits or said receiving circuits.

2. The integrated circuit device of claim 1 wherein said switched routing network utilizes an ID tag in the encoded signal to select an appropriate said receiving circuit and to establish a connection thereto.

* * * * *